United States Patent [19]

Zhu

[11] Patent Number: 5,703,760

[45] Date of Patent: Dec. 30, 1997

[54] MOTHER BOARD WITH FLEXIBLE LAYOUT FOR ACCOMMODATING COMPUTER SYSTEM DESIGN OPTIONS

[75] Inventor: Xiao Feng Zhu, Fremont, Calif.

[73] Assignee: Micronics Computers Inc., Fremont, Calif.

[21] Appl. No.: 568,661

[22] Filed: Dec. 7, 1995

[51] Int. Cl.$^6$ .............................. H01R 9/09; H01R 23/70; H01R 29/00

[52] U.S. Cl. .......................... 361/785; 361/788; 439/61

[58] Field of Search .................................. 361/729–731, 361/733, 784, 785, 788, 789, 796, 803; 395/280, 281, 282, 284, 821, 822, 969; 364/708.1; 439/59, 61, 62, 65

[56] References Cited

U.S. PATENT DOCUMENTS

| | | | |
|---|---|---|---|
| 4,658,333 | 4/1987 | Grimes | 361/785 |
| 4,685,031 | 8/1987 | Fife et al. | 361/785 |
| 5,103,247 | 4/1992 | Sugano et al. | 361/784 |
| 5,513,329 | 4/1996 | Pecone | 395/281 |
| 5,530,623 | 6/1996 | Sanwo et al. | 361/788 |
| 5,604,871 | 2/1997 | Pecone | 395/281 |

*Primary Examiner*—Donald Sparks
*Attorney, Agent, or Firm*—Paul Hentzel

[57] ABSTRACT

Mother board 10M provides a flexible circuit component layout for computer system 10 within housing 10H. The mother board accommodates system component options such as an add-on card 12C or a disk drive bay 10D. Memory module footprint sites 14A–F within memory region 14 are defined on the mother board. Footprints designated in the layout receive components which provide the option flexibility of mother board 10M. Memory module connectors are to be emplaced within the memory region depending on the space requirements of component options. The M memory connectors may be arranged in any configuration selected from a set of multiple possible configurations permitted by M module connectors of T types emplaced in F footprint sites (where F>M). F minus M footprint sites remain vacant without a module connector emplaced therein. These vacant sites provide empty spaces which may be "shuffled around" to accommodate the various system component options. Once a design option has been determined (such as an expansion circuit card or a relocated drive bay) a workable memory connector configuration is selected. The memory connectors are then emplaced in the memory region on the mother board and memory modules are seated in each of the module connectors.

21 Claims, 4 Drawing Sheets

MOTHER BOARD WITH FLEXIBLE LAYOUT FOR ACCOMMODATING COMPUTER SYSTEM DESIGN OPTIONS

TECHNICAL FIELD

This invention relates to computer mother boards having a flexible layout, and more particularly to such mother boards which accommodates computer system design options for various computer environments.

BACKGROUND

Heretofore, each computer system environment required a specific mother board layout for positioning the components on the mother board. Maximum circuit density was preferred in the layouts due to limited space within the computer housing. System upgrades such as an expansion circuit card (and supporting connector) required a corresponding modification in the position and function of neighboring components on the mother board. Even relocating off-board components such as a power supply or a drive bay required mother board modifications. Every system change however minor could have a major effect the mother board layout and wire tracing. Each change required a new mother board specifically arranged for that change.

SUMMARY

It is therefore an object of this invention to provide a flexible layout mother board which accommodates various component arrangements for supporting computer design options.

It is another object of this invention to provide such a flexible layout mother board having a memory region with a reduced lateral profile for the memory modules seated therein.

It is another object of this invention to provide such a flexible layout mother board having a memory region with a reduced vertical profile for the memory modules seated therein.

Briefly, these and other objects of the present invention are accomplished by providing a mother board with a flexible circuit component arrangement. A plurality of circuit card connector slots have circuit cards seated therein. A memory region with F memory footprint sites are defined on the mother board. M memory module connectors of T types are emplaced in some of the F footprint sites. The module connectors are arranged in one configuration selected from multiple possible configurations permitted by M module connectors of T types in F footprint sites. F minus M footprint sites are left vacant without a module connector emplaced therein. These vacant sites provide empty spaces which may be "shuffled around" to accommodate the various system component options. Memory modules having a seated end with contacts engage the module connectors.

BRIEF DESCRIPTION OF THE DRAWING

Further objects and advantages of the present flexible layout mother board and computer system design options therefor will become apparent from the following detailed description and drawing (not drawn to scale) in which.

Figure 1:
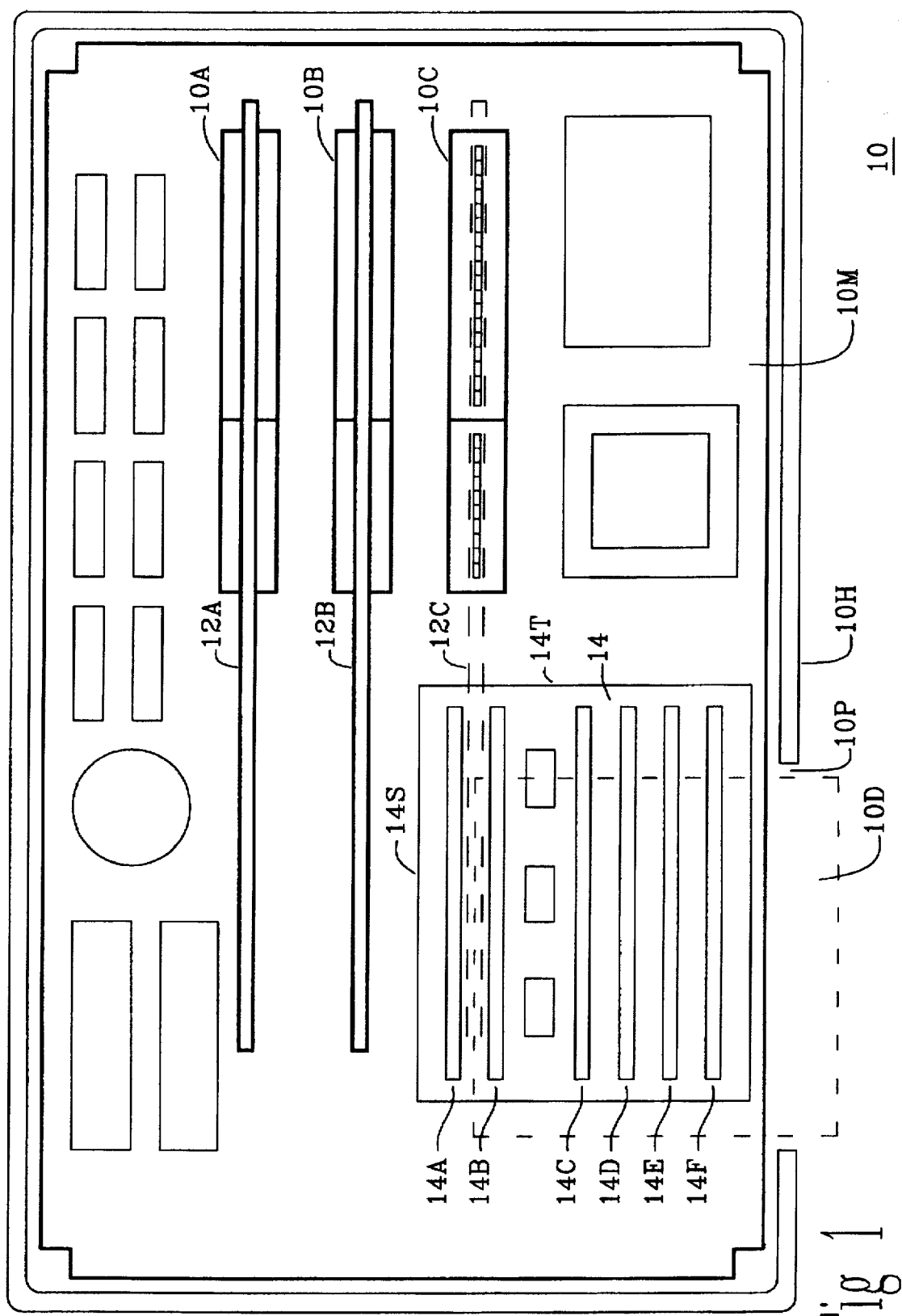
FIG. 1 is a plan view of a flexible layout mother board showing a memory region with memory connector footprints.

The elements of the invention are designated by two digit reference numerals in the above figures. The first digit indicates the figure in which that element is first disclosed or is primarily described. The second digit indicates like features and structures throughout the figures. Some reference numerals are followed by a letter which indicates a subportion or related feature.

GENERAL DESCRIPTION (FIG. 1)

Mother board 10M provides a flexible circuit component layout for computer system 10 within housing 10H. Various circuit components such as circuit card connector slots 10A, 10B and 10C are mounted on the mother board. Circuit cards 12A and 12B are seated in connector slots 10A and 10B. Connector slot 10C does not have a circuit card and remains available for use in a system component option such as an add-on card 12C (shown in dash). Disk drive bay 10D (also shown is dash) is another system component option. The drive bay extends into housing 10H through port 10P, and occupies the overhead area above the mother board. In complex computer system with a large housing, the drive bay may not extend over the mother board. A small housing has less space however, and the drive bay (if any) may extend over the mother board as shown in FIG. 1.

Memory module footprint sites 14A-F within memory region 14 are defined on the mother board. A footprint site is a space on a preassembly stage mother board or "bareboard" reserved for a particular component such as a memory module. Footprints designated in the layout receive components which provide the option flexibility of mother board 10M. Memory module connectors are to be emplaced within the memory region depending on the space requirements of component options such as the expansion circuit card and the drive bay. The space requirements for the circuit card and for the drive bay overlap slightly in the memory region as shown in FIG. 1. These particular options therefore cannot be employed in the same system design.

In the general case, the memory region has F footprints for receiving M memory connectors. The number of footprints in the particular case of FIG. 1 is six which are to receive four memory connectors. Each of the M memory connector is emplaced in one of the F footprint sites, and may be one of T types such as a vertical type (see FIG. 2) or a tilted type (see FIG. 3). The M memory connectors may be arranged in any configuration selected from a set of multiple possible configurations permitted by M module connectors of T types emplaced in F footprint sites (where F>M). Certain configurations support certain system options.

F minus M footprint sites remain vacant without a module connector emplaced therein. The position of the vacant footprints within the memory region depends on the selected configuration of the memory connectors. These vacant sites provide empty spaces which may be "shuffled around" to accommodate the various system component options. At least some of the F minus M vacant footprint sites may be positioned together forming at least one vacant area larger then a single vacant footprint site. Alternatively, all of the vacant sites may be positioned together forming the largest possible vacant area (see FIG. 2). Once a design option has been determined (such as an expansion circuit card or a relocated drive bay) a workable memory connector configuration is selected. The memory connectors are then emplaced in the memory region on the mother board and memory modules are seated in each of the module connectors.

SIX FOOTPRINT SITE EMBODIMENT (FIG. 1)

Memory region 14 as shown in the embodiment of FIG. 1 may provide four memory connectors of two types arranged in six footprint sites (M=4, T=2, and F=6). The memory region is preferable rectangular in shape formed by a first and a second side boundary 14S in opposed spaced relationship, and a first and a second end boundary 14T in opposed spaced relationship. The F footprint sites are six elongated sites sequentially arranged within the memory region. The footprint sites are parallel with respect to the side boundaries and extend between the end boundaries. The first elongated site 14A is adjacent to the first side boundary. The second elongated site 14B is adjacent to the first elongated site. The third elongated site 14C is adjacent to the second elongated site. The fourth elongated site 14D is adjacent to the third elongated site. The fifth elongated site 14E is adjacent to the fourth elongated site. The sixth elongated site 14F is adjacent to the fifth elongated site and also adjacent to the second side boundary. The four module connectors may be either a first type (vertical see FIG. 2) or a second type (tilted see FIG. 3) or a mixture of types (see FIG. 4) emplaced in four of the six footprint sites. Two sites are left vacant without a module connector, forming two vacant strips within the memory region extending between end boundaries 14T.

Figure 2A:
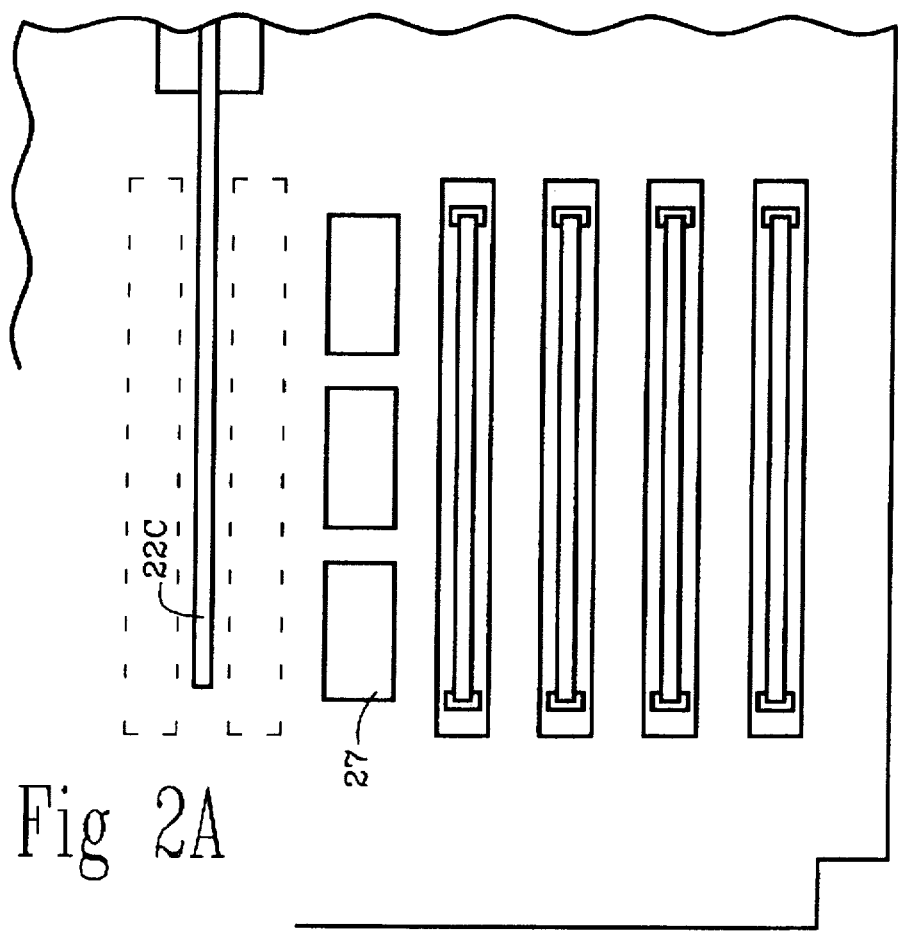
FIG. 2A is a fragmentary plan view of the memory region for the mother board of FIG. 1 showing four vertical memory modules.
Figure 2B:
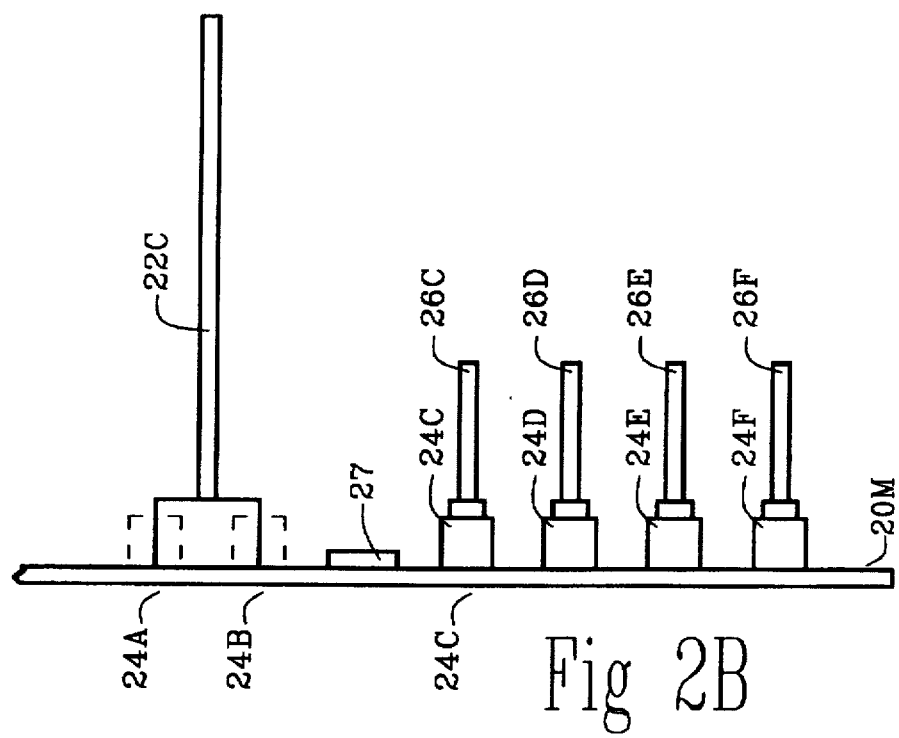
FIG. 2B is a side view of the vertical memory modules of FIG. 2A.

VERTICAL EMBODIMENT (FIGS. 2A and 2B)

Four module connectors 25C, 25D, 25E and 25F shown in the embodiment of FIG. 2 are emplaced in four footprint sites. The memory connectors are the vertical type with vertical connector construction for seating four memory modules 26C, 26D, 26E and 26F at an orthogonal angle relative to the plane of mother board 20M. First and second footprint sites 24A and 24B are the vacant sites (F−M=2) positioned close together forming a double vacant strip. The vacant sites combine to provide a single large vacant area at one end of the memory region. The four vertical type module connectors are emplaced together at the other end of the memory region in the third, fourth, fifth, and sixth sites. The sixth site containing connector 25F with memory modules 26F is adjacent to the housing.

The four memory modules seated in the memory connectors may be any suitable memory device such as single in-line memory modules (SIMMs) or dual in-line memory modules (DIMMs). One SIMM may provide 32 megabytes of memory, which totals 128 megabytes in the four SIMM embodiment of FIG. 2. The memory connectors are emplaced close together causing the memory modules to collectively present a reduced lateral profile for spatially accommodating adjacent components such as the add-on circuit card 22C. That is, the horizontal distance from module connector 25C to module connector 25F is reduced by the close spacing between the module connectors. The industry standard for center-to-center spacing between memory modules is about 0.455 inches (about 1.16 cm).

Therefore the lateral profile for the four memory modules shown in FIG. 2 about 1.8 inches (about 4.6 cm). The add-on circuit card extends into the memory region generally parallel with the module connectors occupying the space provided by the double vacant strip.

Memory driver chips 27 mounted in a driver footprint site provide the circuitry required to access the memory modules. Locating the driver chips in a row within the memory region near the memory modules facilitates the routing of data traces into and out of the memory modules. The memory driver footprint site between the second and third footprint sites 24B and 24C is proximate the double vacant strip. The driver footprint site expands vacant area to a triple vacant strip.

Figure 3A:
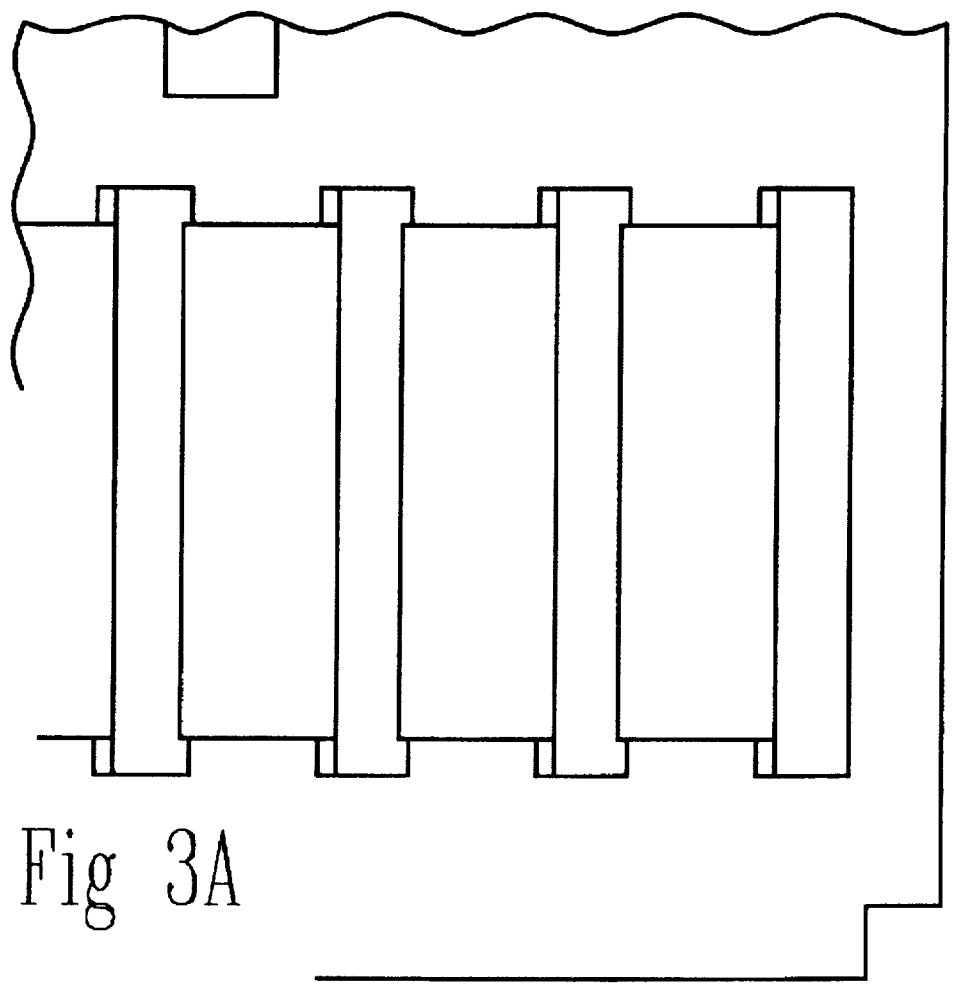
FIG. 3A is a fragmentary plan view of the memory region for the mother board of FIG. 1 showing four tilted memory modules.
Figure 3B:
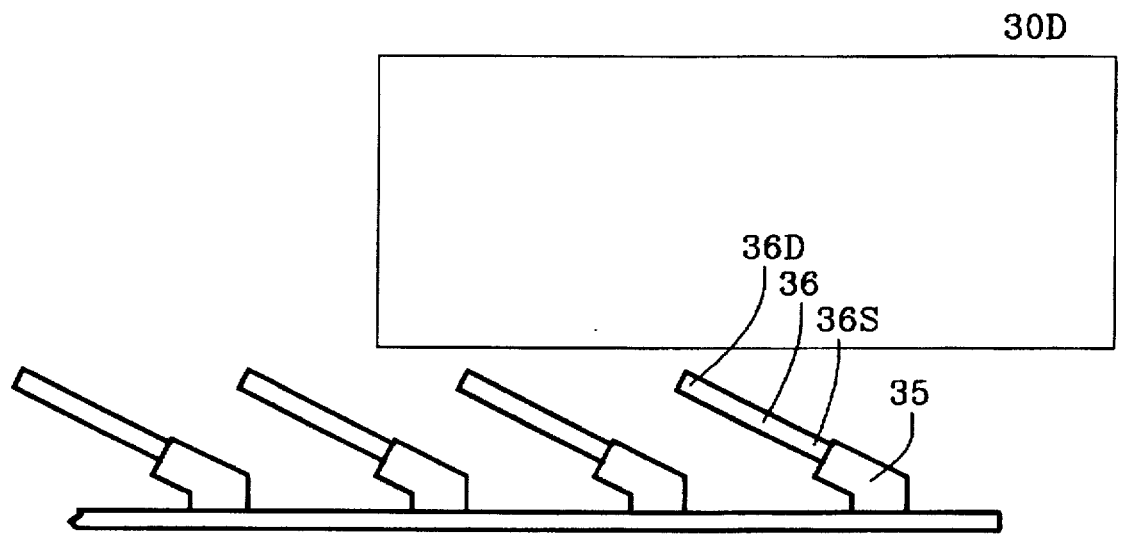
FIG. 3B is a side view of the tilted memory modules of FIG. 3A.

TILTED EMBODIMENT (FIGS. 3A and 3B)

The four module connectors 35 shown in the embodiment of FIG. 3 are the tilted type with tilted connector construction for seating the four memory modules 36 at an acute angle relative to the plane of the mother board. The two vacant footprint sites are positioned separate from each other. Each vacant footprint site is positioned adjacent to a tilted type module connector. Each memory modules has a seated end 36S with contacts for engaging the module connector, and a distant end 36D remote from the memory connector. The vacant sites are on the side of the memory connector toward which the connector tilts. Each vacant site occupies the space under the distant end of the memory module seated in the adjacent module connector.

The memory modules seated in the four tilted type module connectors collectively present a reduced vertical profile for spatially accommodating overhead components such as drive bay 30D. That is, the effective height of each memory modules from the tip of the distant end down to the seated end near the mother board is reduced by the tilt. For a memory module having a height dimension of about 1.3 inches (about 3.3 cm) the height requirement is reduced to about 0.92 inches (about 2.3 cm) for a 45 degree tilt, to about 0.65 inches (about 1.6 cm) for a 30 degree tilt, and to about 0.44 inches (about 1.1 cm) for a 20 degree tilt.

Figure 4A:
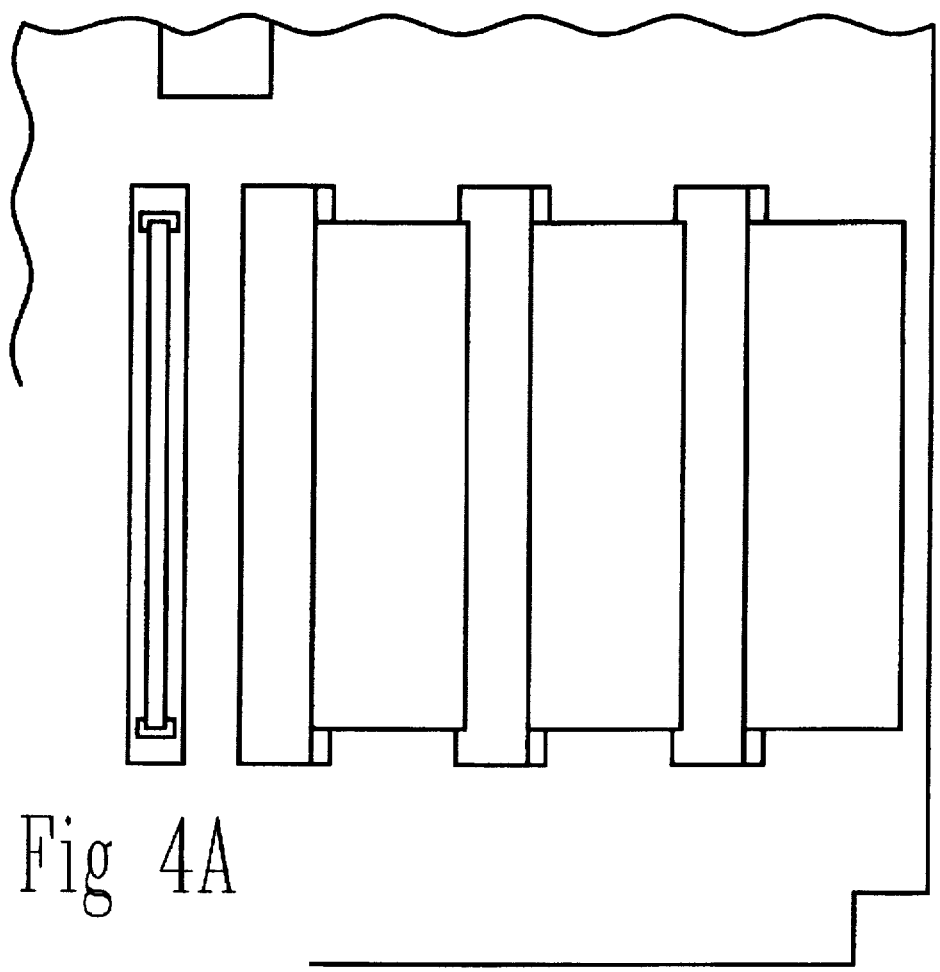
FIG. 4A is a fragmentary plan view of the memory region for the mother board of FIG. 1 showing vertical and tilted memory modules.
Figure 4B:
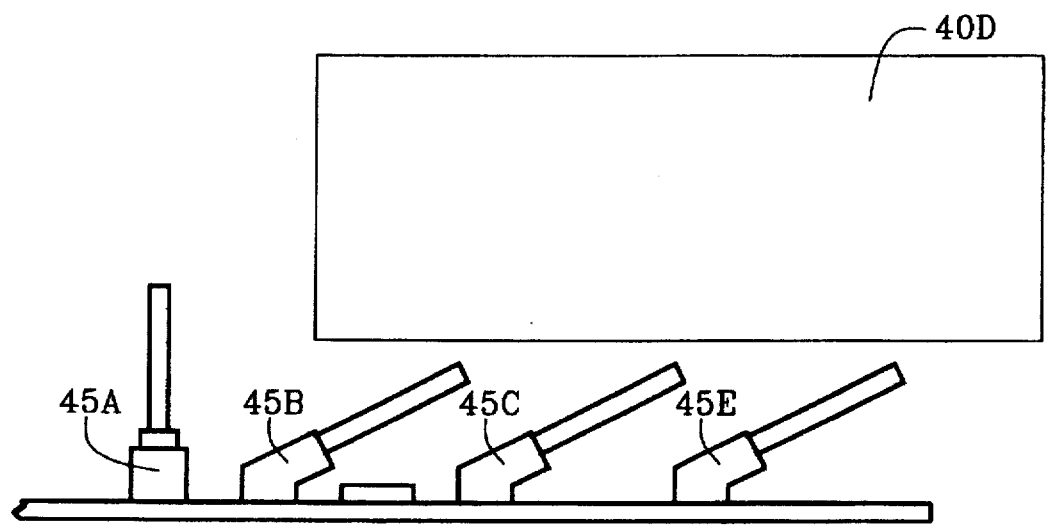
FIG. 4B is a side view of the vertical and tilted memory modules of FIG. 4A.

MIXED EMBODIMENT (FIGS. 4A and 4B)

In the mixed module embodiment of FIG. 4, at least some of the module connectors are the vertical type and at least some of the module connectors are the tilted type. The three module connectors 45B, 45C, and 45E are the tilted type with a tilted connector construction in order to accommodate drive bay 40D. These memory connectors are emplaced in the second footprint site, the third footprint site, and the fifth footprint site. The remaining one of the module connector 45A is the vertical type with vertical connector construction, and is emplaced in the first footprint site. The acute angle of the memory modules is any suitable angle between 20 degrees and 45 degrees which reduces the vertical profile of the memory modules. An acute angle of about 30 degrees is preferred.

INDUSTRIAL APPLICABILITY

It will be apparent to those skilled in the art that the objects of this invention have been achieved as described hereinbefore.

CONCLUSION

Clearly various changes may be made in the structure and embodiments shown herein without departing from the concept of the invention. Further, features of the embodiments shown in the various figures may be employed with the embodiments of the other figures. Therefore, the scope of the invention is to be determined by the terminology of the following claims and the legal equivalents thereof.

I claim as my invention:

1. A computer apparatus comprising a mother board for providing a flexible circuit component layout thereon, comprising:

a plurality of circuit card connector slots;

circuit cards seated in at least some of the circuit card connector slots;

F memory footprint sites within a memory region defined on the mother board;

M memory module connectors of T types where F>M, each one emplaced in one of the F footprint sites within the memory region, the module connectors arranged in any configuration selected from multiple possible configurations permitted by M module connectors of T types in F footprint sites leaving F minus M vacant footprint sites without a module connector emplaced therein; and M memory modules having a seated end with contacts for engaging the module connector and a distant end, one memory module seated in each of the module connectors emplaced in the memory region.

2. The computer apparatus of claim 1, wherein at least some of the module connectors are a vertical type with vertical connector construction for seating the memory modules at an orthogonal angle relative to the mother board.

3. The computer apparatus of claim 2, wherein at least some of the F minus M vacant footprint sites are positioned together forming at least one vacant area larger then a single vacant footprint site.

4. The computer apparatus of claim 2, wherein all of the F minus M vacant footprint sites are positioned together forming a single large vacant area.

5. The computer apparatus of claim 4, wherein the single large vacant area is at one end of the memory region.

6. The computer apparatus of claim 5, wherein the vertical type module connectors are emplaced together, and the memory modules seated therein collectively present a reduced lateral profile for spatially accommodating adjacent components.

7. The computer apparatus of claim 1, wherein at least some of the module connectors are a tilted type with tilted connector construction for seating the memory modules at an acute angle relative to the mother board.

8. The computer apparatus of claim 7, wherein each of the F minus M vacant footprint sites is positioned separate from the other vacant footprint sites, and each vacant footprint site is positioned adjacent to a tilted type module connector on the side toward which the connector tilts, and occupies the space under the distant end of the memory module seated in the adjacent module connector.

9. The computer apparatus of claim 7, wherein the memory modules seated in the tilted type module connectors collectively present a reduced vertical profile for spatially accommodating overhead components.

10. The computer apparatus of claim 1, wherein the memory region defined on the mother board has a first side boundary and a second side boundary in opposed spaced relationship, and a first end boundary and a second end boundary in opposed spaced relationship;

the F footprint sites are six elongated sites sequentially arranged within the memory region in parallel with respect to the side boundaries, and extending between the end boundaries;

the first elongated site is adjacent to the first side boundary;

the second elongated site is adjacent to the first elongated site;

the third elongated site is adjacent to the second elongated site;

the fourth elongated site is adjacent to the third elongated site;

the fifth elongated site is adjacent to the fourth elongated site;

the sixth elongated site is adjacent to the fifth elongated site and adjacent to the second side boundary;

the M module connectors are four elongated connectors of either a first type or a second type emplaced in four of the six footprint sites leaving two vacant sites without a module connector, each vacant site forming a vacant strip within the memory region extending between the end boundaries; and the M memory modules are four memory boards seated in the four module connectors.

11. The computer apparatus of claim 10, wherein all four of the module connectors are a vertical type with vertical connector construction for seating the memory modules at an orthogonal angle relative to the mother board.

12. The computer apparatus of claim 11, wherein the two vacant sites without a connector module are adjacent forming a double vacant strip within the memory region extending between the end boundaries.

13. The computer apparatus of claim 12, further comprising an add-on circuit card which extends into the memory region generally parallel with the module connectors occupying the space above the double vacant strip.

14. The computer apparatus of claim 12, wherein the first and second sites are the vacant sites forming the double vacant strip, and the four vertical type module connectors are seated in the third, fourth, fifth, and sixth sites, and the sixth site is adjacent to the housing.

15. The computer apparatus of claim 12, further comprising a memory driver footprint site proximate the double vacant strip forming a triple vacant strip; and memory driver means seated in the driver footprint site.

16. The computer apparatus of claim 10, wherein some of the module connectors are a tilted type with a tilted connector construction for seating the memory modules at an acute angle relative to the mother board, and the remainder of the module connectors are a vertical type with a vertical connector construction for seating the memory module at an orthogonal angle relative to the mother board.

17. The computer apparatus of claim 16, wherein the sixth footprint site is adjacent to the housing, three of the module connectors are the tilted type and are emplaced in second, third, and fifth footprint sites, and one of the module connectors is the vertical type and is emplaced in first footprint site.

18. The computer apparatus of claim 16, further comprising a memory driver footprint site between the second and third footprint site, and memory driver means seated in the driver footprint site.

19. The computer apparatus of claim 16, further comprising housing means for containing the mother board; and a disc drive bay which extends into the memory region through the housing occupying the space above the tilted memory modules.

20. The computer apparatus of claim 16, wherein the acute angle of the memory modules is about 30 degrees.

21. The computer apparatus of claim 10 wherein all four of the module connectors are a tilted type with a tilted connector construction for seating the memory modules at an acute angle relative to the mother board.

* * * * *